US008030928B2

(12) United States Patent
Li et al.

(10) Patent No.: US 8,030,928 B2
(45) Date of Patent: Oct. 4, 2011

(54) MAGNETIC RESONANCE COIL FIXED IN PLACE BY AIR PRESSURE

(75) Inventors: Feng Hua Li, Shenzhen (CN); Ting Qiang Xue, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 298 days.

(21) Appl. No.: 12/344,911

(22) Filed: Dec. 29, 2008

(65) Prior Publication Data
US 2009/0171189 A1 Jul. 2, 2009

(30) Foreign Application Priority Data
Dec. 29, 2007 (CN) .......................... 2007 2 0310196

(51) Int. Cl.
*G01V 3/00* (2006.01)
(52) U.S. Cl. ...................................................... 324/318
(58) Field of Classification Search .......... 324/300–322; 600/410–435
See application file for complete search history.

(56) References Cited

U.S. PATENT DOCUMENTS

| 5,280,248 | A  | * | 1/1994  | Zou et al. ........................ 324/318 |
| 5,655,533 | A  | * | 8/1997  | Petropoulos et al. .......... 600/422 |
| 5,760,586 | A  | * | 6/1998  | Foerster et al. ............... 324/321 |
| 5,783,943 | A  | * | 7/1998  | Mastandrea et al. .......... 324/318 |
| 6,211,677 | B1 | * | 4/2001  | Burl et al. ..................... 324/322 |
| 6,894,497 | B2 | * | 5/2005  | Renz ............................. 324/318 |
| 6,950,005 | B2 | * | 9/2005  | Christopherson et al. .... 336/198 |
| 7,256,581 | B2 | * | 8/2007  | Schuster et al. ............... 324/318 |
| 7,288,938 | B2 | * | 10/2007 | Chmielewski et al. ....... 324/318 |
| 7,463,028 | B2 | * | 12/2008 | Dietz et al. .................... 324/318 |
| 7,663,366 | B2 | * | 2/2010  | Takamori ...................... 324/318 |

* cited by examiner

*Primary Examiner* — Dixomara Vargas
(74) *Attorney, Agent, or Firm* — Schiff Hardin LLP

(57) ABSTRACT

An air pressure fixed coil for magnetic resonance imaging has a surface on which an air pressure fixing device is arranged. The air pressure fixing device is in communication with a control switch, that is operable to actuate the air pressure fixing device to generate a negative pressure or to restore a normal air pressure, so that the air pressure fixing device is suctioned and fixed onto an object, or is released from the object. Since the coil is fixed in place by using air pressure, the coil can be fixed onto a patient bed without arranging any fixing structure on the patient bed, and therefore the coil can be positioned and fixed at any place on the patient bed for carrying out a scanning operation according to needs. At the same time, since there is no need to pre-arrange any fixing structure on the patient bed, such as slots, holes etc., the structural strength of the patient bed will not be affected, and the appearance of the patient bed can be kept simple, clean and neat.

6 Claims, 5 Drawing Sheets

MAGNETIC RESONANCE COIL FIXED IN PLACE BY AIR PRESSURE

BACKGROUND OF THE INVENTION

1. Field of the Invention

The present invention concerns a coil for a magnetic resonance imaging system, and particularly an arrangement for fixing such a coil in place.

2. Description of the Prior Art

In a magnetic resonance system, there is a need to use a strong electromagnetic field created by high-powered radio frequency signals so as to excite nuclei in a human body to generate magnetic resonance signals, and then the magnetic resonance signals emitted from the human body are received. The said magnetic resonance signals are reconstructed into magnetic resonance images in a known manner. When a body is examined, normally it is necessary to position one or more radio frequency coils on a patient's bed with their field of view oriented at different parts of the human body, and a suitable coil needs to be placed at a corresponding position in order to carry out a scanning.

FIGS. 1 to 3 show schematic diagrams of the structure of a currently available breast coil and the manner of fixing it onto a patient bed. Tabs 14 are arranged respectively on both sides 12 of a breast coil 10 in a direction facing a patient bed 20. A plurality of slots 22 are formed respectively on both sides of the patient bed 20 along its longitudinal direction. When the breast coil 10 is used to carry out an examination, said tabs 14 are inserted along the arrow direction into the corresponding slots 22 according to the position that the patient is in said patient bed 20 or the patient's body height, so that the breast coil 10 can be fixed onto said patient bed 20.

FIGS. 4 to 6 show schematic diagrams of the structure of a currently available head coil and the manner of fixing it onto a patient bed. A number of studs 34 are arranged respectively on the bottom surface 32 of a head coil 30 in a direction facing a patient bed 20. A number of corresponding holes 24 are formed on the patient bed 20. When the head coil 30 is used to carry out an examination, the studs 34 are inserted along the arrow direction into the corresponding holes 24, so that the head coil 30 can be fixed onto the patient bed 20.

It can be seen that in such a currently available magnetic resonance imaging system, in order to fix different coils at different positions on the patient bed, it is necessary to arrange correspondingly specific structures, such as tabs and slots, studs and holes, etc., on the various coils and on the patient bed, so as to carry out the positioning or fixing therebetween.

Since specific structures have to be designed on a patient bed, such as forming slots, holes, etc., the strength of the bed base may be affected. In addition, the structures such as slots, holes, etc. tend to be soiled and collect dirt easily, therefore it is necessary for them to be cleaned regularly to prevent disease transmission.

In order to use a coil for scanning at a variety of positions, it is necessary to make a series of slots or holes on the patient bed, and this further reduces the structural strength of the patient bed. Furthermore, such a coil can only be located on the positions where the slots and holes are formed, and this leads to inconvenient placement operations, and also restricts the flexibility in using the coil.

SUMMARY OF THE INVENTION

An object of the present invention is to provide an air pressure fixed coil, meaning a coil that is fixed in place by air pressure, for which there is no need to pre-arrange any fixing structure, that can be placed and fixed at any position on a patient bed according to needs, and that will not affect the structural strength of the patient bed.

The above object is achieved in accordance with the present invention by an air pressure fixed coil, having a surface, with an air pressure fixing device arranged on this surface, and the air pressure fixing device is in communication with a control switch. The control switch actuates the air pressure fixing device to generate a negative pressure or to restore a normal air pressure, so that the air pressure fixing device is suctioned and fixed onto an object, or is released from the object.

According to one aspect of the present invention, the air pressure fixing device is an extendible airbag, and the control switch is a knob. When the knob is rotated, the extendible airbag is extended so that negative pressure is generated in the extendible airbag. When the knob is returned to an initial position, the extendible airbag is restored to an initial state, so as to restore the normal air pressure.

According to another aspect of the present invention, the air pressure fixing device is formed by a piston and cylinder and at least one airbag in communication with the piston. The piston is in association with the control switch. The control switch is a knob, and when said knob is rotated, the piston is pulled so as to generate a negative pressure in the cylinder, so that negative pressure is generated in the airbag in communication with the cylinder. When said knob is returned to an initial position, said piston is returned to an initial state so as to restore the normal air pressure in the cylinder, which in turn restores the normal air pressure in the airbag in communication with the cylinder.

Since in the present invention a coil is held in place by using air pressure for fixing, the coil can be fixed onto a patient bed without pre-arranging any fixing structure on the patient bed, and therefore the coil can be positioned and fixed on any place on the patient bed for carrying out a scanning operation according to needs. At the same time, since there is no need to pre-arrange any fixing structure on the patient bed, such as slots, holes, etc., the structural strength of the patient bed will not be affected, also the appearance of the patient bed can be kept simple, clean and neat.

DESCRIPTION OF THE PREFERRED EMBODIMENTS

The basic design concept of the air pressure fixed coil of the present invention is to arrange an air pressure fixing device on a surface of the coil for contacting with a patient bed, and to utilize the air pressure fixing device to generate a negative pressure or to restore a normal air pressure so as to cause the air pressure fixing device to be suctioned and fixed onto, or to be released from, the patient bed, so that said coil is fixed onto or removed from the patient bed.

Figure 1:
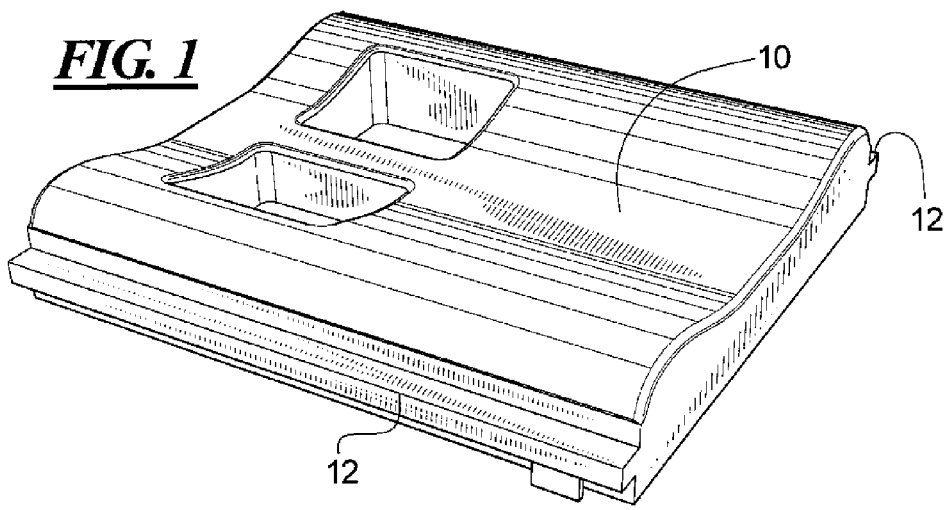
FIGS. 1 to 3 show schematic diagrams of the structure of a currently available breast coil and the way of fixing it onto a patient bed.
Figure 2:
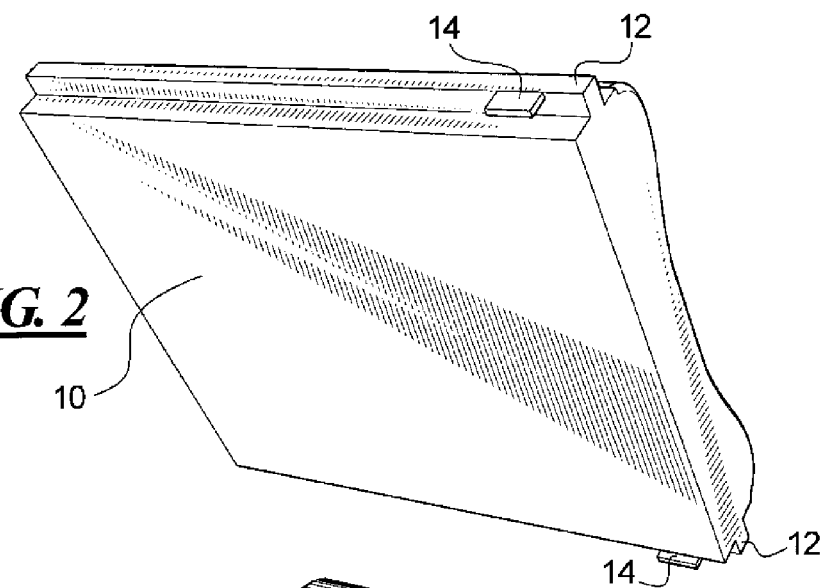
Figure 3:
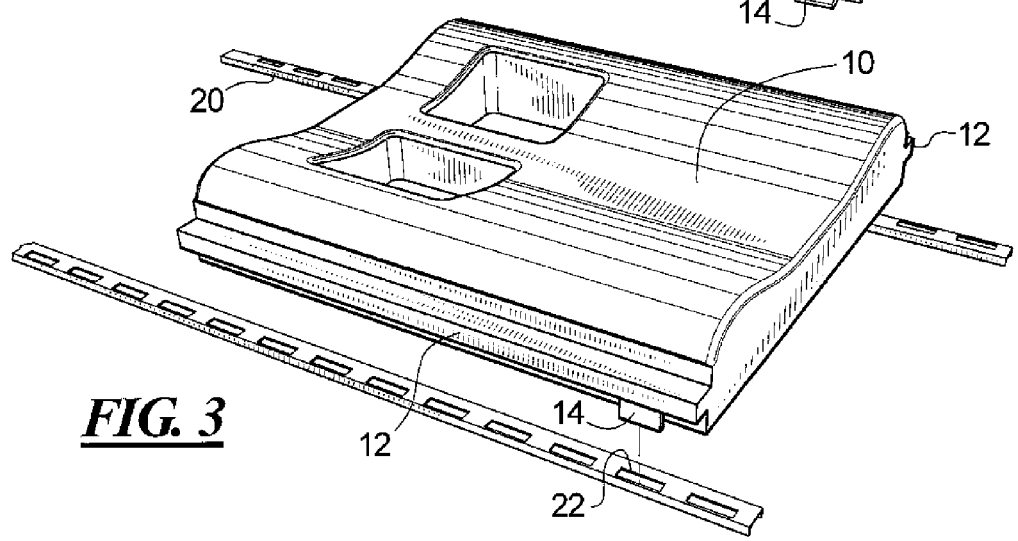
Figure 4:
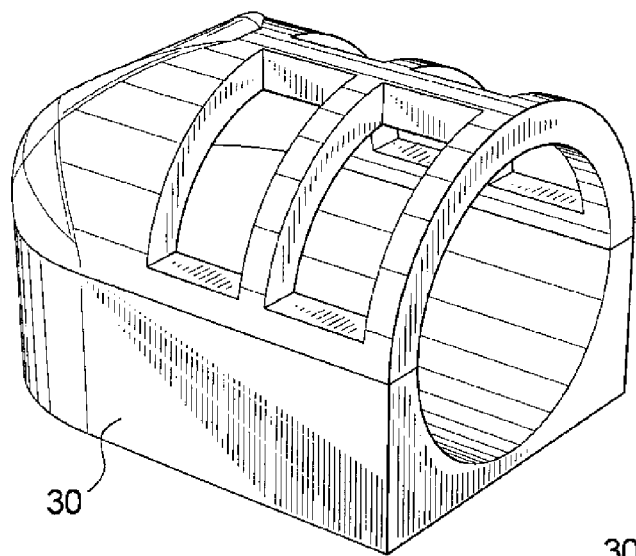
FIGS. 4 to 6 show schematic diagrams of the structure of another currently available coil and the way of fixing it onto a patient bed.
Figure 5:
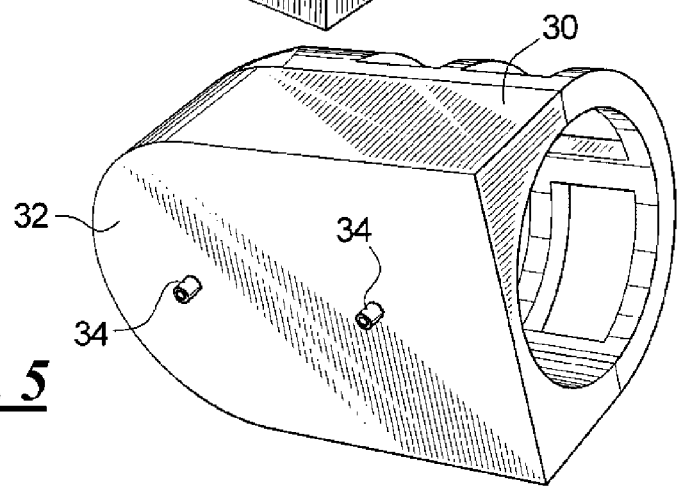
Figure 6:
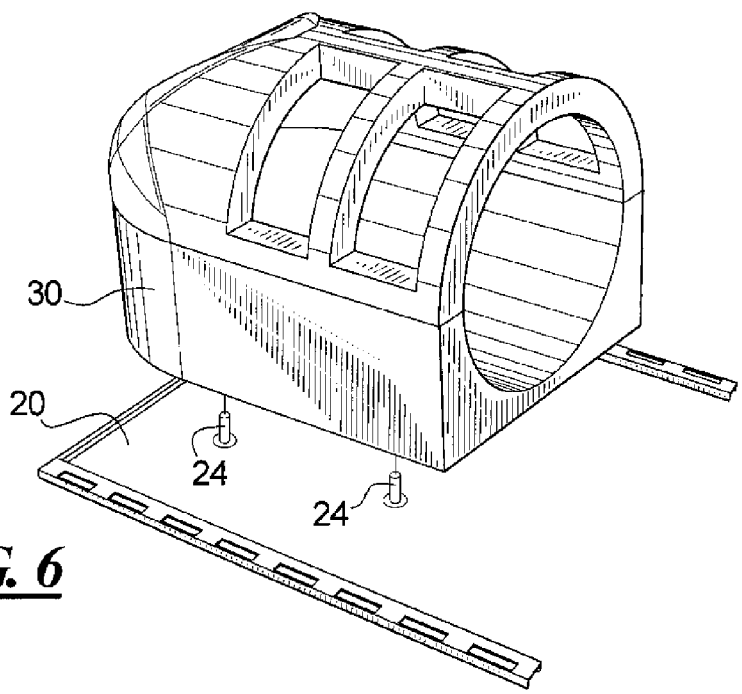
Figure 7:
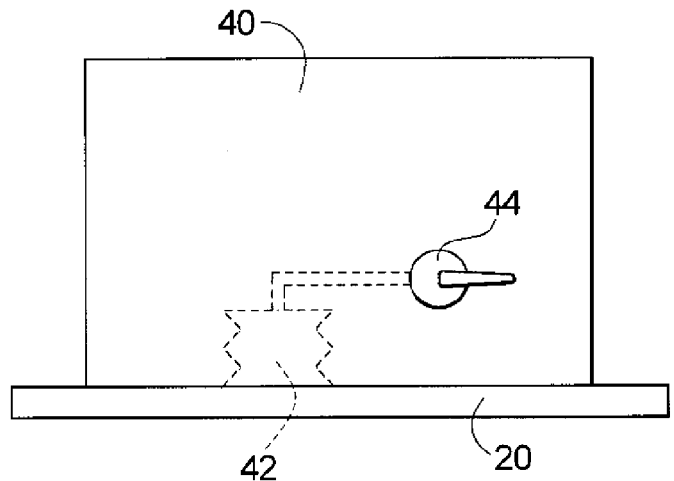
FIGS. 7 to 8 are schematic diagrams of the basic principles of an embodiment of an air pressure fixing device of an air pressure fixed coil of the present invention.
Figure 8:
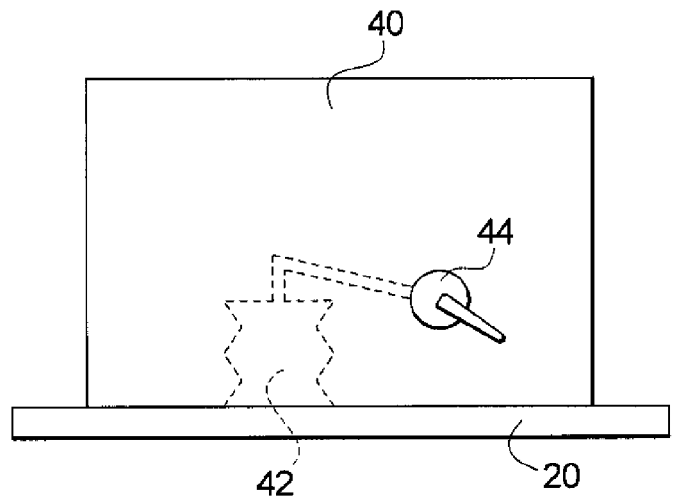

FIGS. 7 to 8 show the basic structure of a fixing device of an embodiment of the air pressure fixed coil of the present invention. On a surface of the coil 40, which is normally its bottom surface, is arranged an air pressure fixing device 42. When the coil 40 is used, the bottom surface thereof is placed on a patient bed 20. Said air pressure fixing device 42 is in communication with a control switch 44, and by operation of the control switch 44 the air pressure fixing device 42 is actuated to generate a negative pressure or to restore to a normal air pressure, so that the air pressure fixing device 42 is suctioned and fixed onto the patient bed 20, or is released from said patient bed 20. In this embodiment, the air pressure fixing device 42 is an extendible airbag. Said control switch 44 is a knob. When the knob is rotated, it extends the extendible airbag, thus causing the space in the extendible airbag to be increased and the air pressure to be reduced, and in this case since the external atmosphere pressure is higher than the air pressure inside the extendible airbag, the extendible airbag is suctioned and fixed onto the patient bed 20, so the coil 40 is thereby fixed onto said patient bed 20. When said knob is returned to its initial position, the air pressure in the extendible airbag is restored to the normal state and the airbag is released from the patient bed 20, and then the coil 40 can be easily removed.

Figure 9:
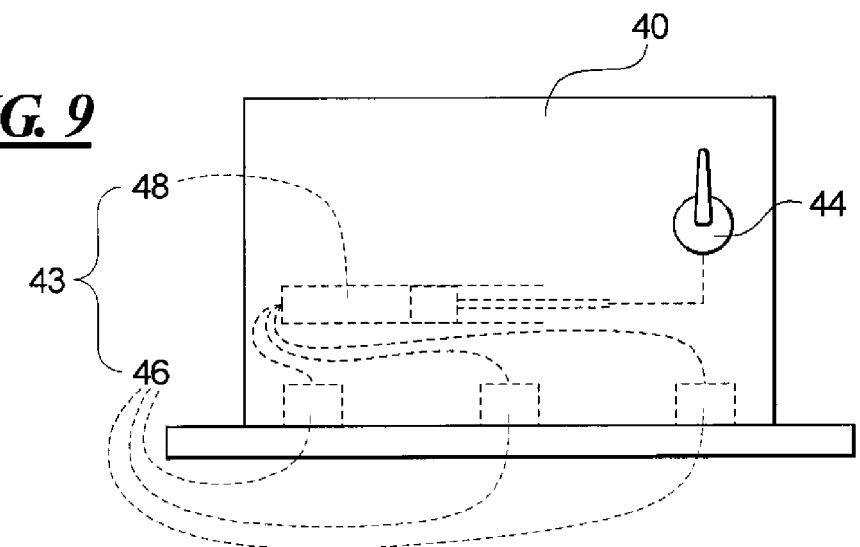
FIG. 9 is a schematic diagram of the basic principles of another embodiment of an air pressure fixing device of the air pressure fixed coil of the present invention.

FIG. 9 shows the basic structure of another embodiment of a fixing device for the air pressure fixed coil of the present invention. On a surface of the coil 40, which is normally its bottom surface, arranged an air pressure fixing device 43 is arranged. When the coil 40 is used, the bottom surface thereof is placed on a patient bed 20. The air pressure fixing device 43 is in communication with a control switch 44, and by operation of this control switch 44, the air pressure fixing device 43 is actuated to generate a negative pressure or to restore a normal air pressure, so that the air pressure fixing device 43 is suctioned and fixed onto the patient bed 20 or is released from said patient bed 20. In this embodiment, the air pressure fixing device 43 is formed by at least one airbag 46 (typically a number of airbags) arranged on a bottom surface of the coil, and a piston 48 in a cylinder in communication with the airbag 46 and the control switch 44. The control switch 44 is a knob. When the knob is rotated, the piston 48 is pulled inside the cylinder, and this causes the volume inside the cylinder 48 to be increased and the air pressure to be reduced, so that a negative pressure is generated in the airbag 46 in communication with the cylinder, causing the extendible airbag 46 to be suctioned and fixed onto the patient bed 20, and the coil 40 in turn is fixed onto the patient bed 20. When the knob is restored to its initial position, the piston 48 is restored to its initial state, and the air pressure in the cylinder is also restored to the normal state, so that the air pressure in the airbag 46 in communication with the cylinder is restored to normal and the airbag is released from the patient bed 20, so the coil 40 can be easily removed.

Figure 10:
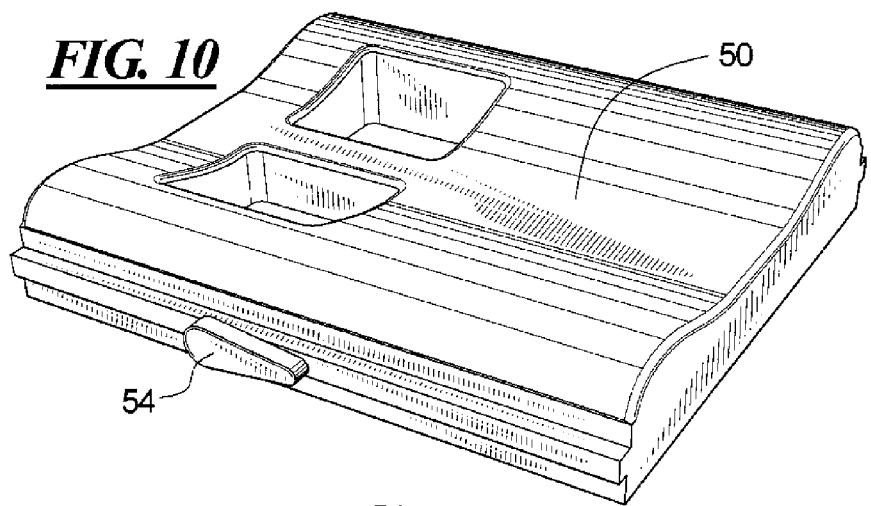
FIGS. 10 to 12 are schematic diagrams of the basic principles of a further embodiment of the air pressure fixed coil of the present invention and the manner of fixing it onto a patient bed.
Figure 11:
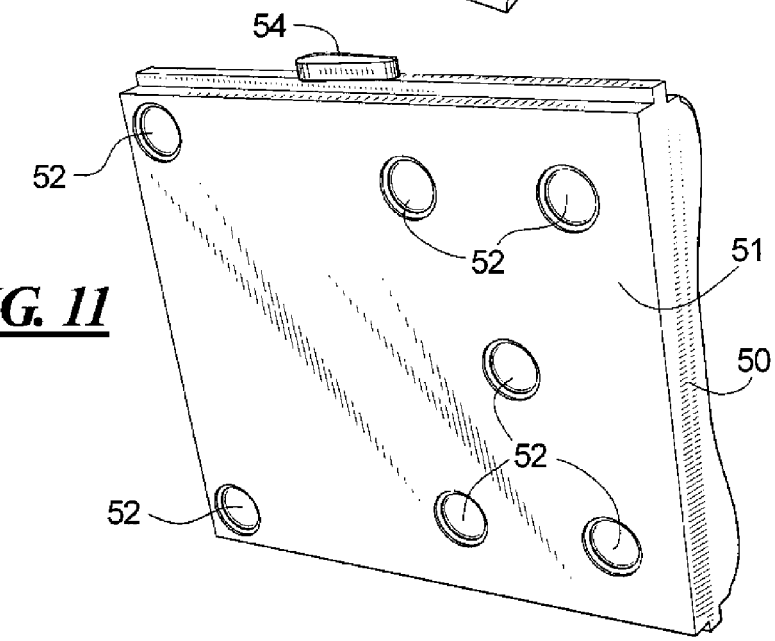
Figure 12:
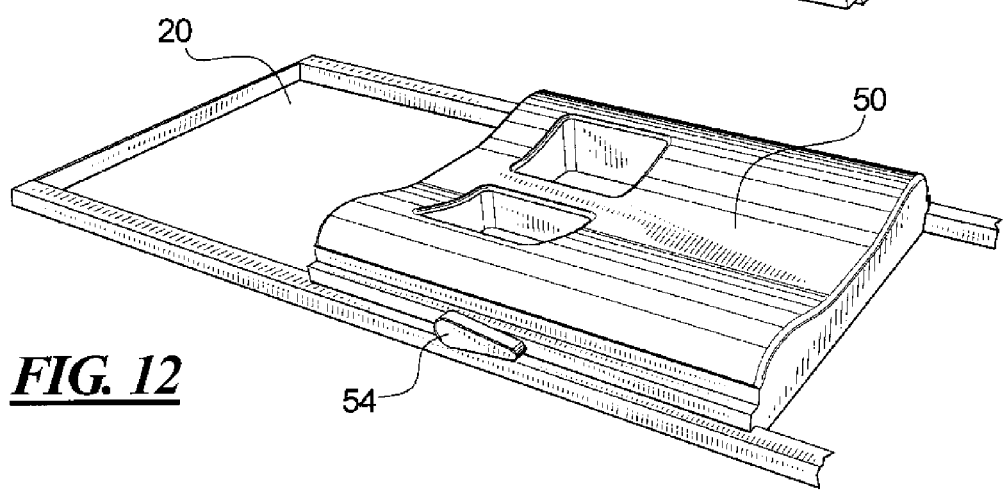

Referring to FIGS. 10 to 12, in a particular application of the air pressure fixed coil of the present invention, for which a breast coil 50 is used as an example, the breast coil 50 has a bottom surface 51, and at least one air pressure fixing device 52 is arranged on the bottom surface 51. The air pressure fixing device 52 can be implemented as an extendible airbag 42 shown in FIGS. 7 to 8, or as an air pressure fixing device 43 having a piston 48 in a cylinder and at least one airbag 46 in communication with the cylinder as shown in FIG. 9. The air pressure fixing device 52 is in communication with a control switch 54 arranged on the breast coil 50, and the airbag 52 is actuated by the control switch 54 to generate a negative pressure or to restore a normal air pressure, so that the air pressure fixing device 52 is suctioned and fixed onto the patient bed 20 or is released from the patient bed 20, so as to fix the breast coil 50 onto the patient bed 20 or to remove it from the patient bed 20.

Figure 13:
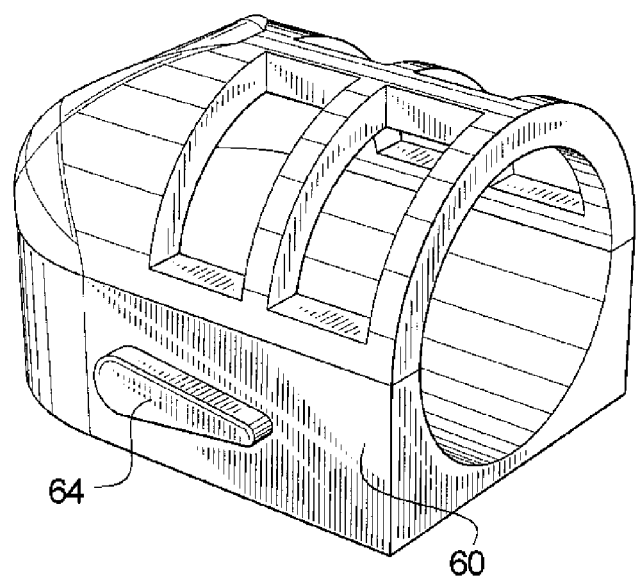
FIGS. 13 to 15 are schematic diagrams of the structure of another embodiment of the air pressure fixed coil of the present invention and the manner of fixing it onto a patient bed.
Figure 14:
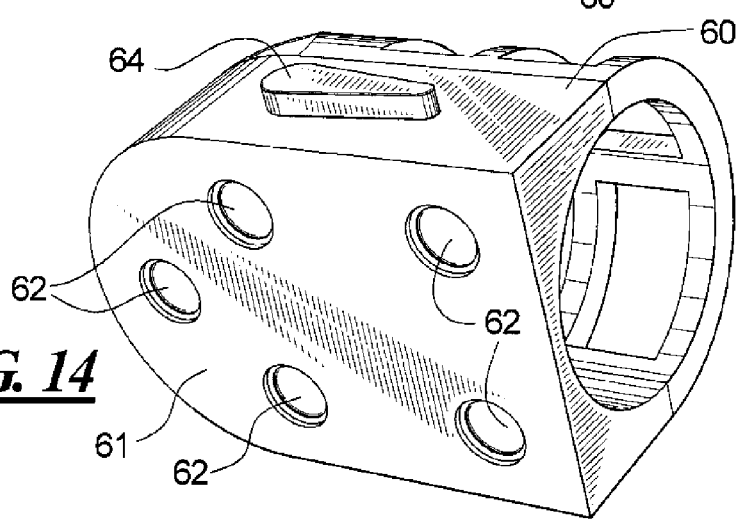
Figure 15:
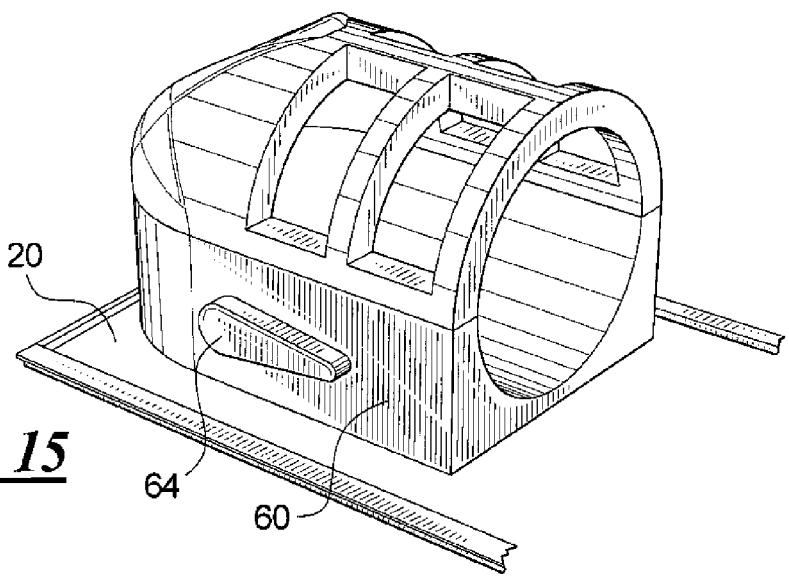

Referring to FIGS. 13 to 15, in another particular application of the air pressure fixed coil of the present invention, for which a head coil 60 is used as an example, the head coil 60 has a bottom surface 61, and at least one air pressure fixing device 62 is arranged on the bottom surface 61. The air pressure fixing device 62 can be implemented as an extendible airbag 42 as shown in FIGS. 7 to 8, or as an air pressure fixing device 43 having a piston 48 in a cylinder and at least one airbag 46 in communication with the cylinder as shown in FIG. 9. The air pressure fixing device 62 is in communication with a control switch 64 arranged on the head coil 60, and the air pressure fixing device 62 is actuated by the control switch 64 to generate a negative pressure or to restore a normal air pressure, so that the pressure fixing device 62 is suctioned and fixed onto the patient bed 20, or is released from the patient bed 20, so as to fix the head coil 60 onto the patient bed 20 or remove it from the patient bed 20.

Since in the present invention a coil is fixed in place by using air pressure for fixing, the coil can be fixed onto a patient bed without pre-arranging any fixing structure on the patient bed. This allows the coil to be positioned and fixed at any place on the patient bed for carrying out a scanning operation according to needs. At the same time, since there is no need to pre-arrange any fixing structure on the patient bed, such as slots, holes, etc., the structural strength of the patient bed will not be affected, and the appearance of the patient bed can be kept simple, clean and neat.

Although modifications and changes may be suggested by those skilled in the art, it is the intention of the inventors to embody within the patent warranted hereon all changes and modifications as reasonably and properly come within the scope of their contribution to the art.

We claim as our invention:
1. A coil arrangement for medical imaging, comprising:
   an electromagnetic coil configured to receive or detect signals for medical imaging;
   a holder to which said coil is attached, said holder having an external surface with an opening therein;
   an air pressure fixing device contained in said holder and being in pressure-communicating connection with said opening in said external surface configured to abut an object;
   a control switch that operates said air pressure fixing device to cause a negative pressure to be generated by said air pressure fixing device that is communicated through said opening to suction said external surface onto the object to hold said holder, and said coil attached thereto, at said object, and to restore ambient air pressure to said air pressure fixing device to release said holder, and said coil attached thereto, from said object.
2. A coil arrangement as claimed in claim 1 wherein said air pressure fixing device comprises an extendible airbag.

3. A coil arrangement as claimed in claim 2 wherein said control switch is a manually rotatable knob, with said knob being operably connected to said extendible airbag to extend said extendible airbag when said knob is rotated in a first direction to generate said negative pressure inside said extendible airbag, and to restore said extendible airbag to an initial state when said knob is rotated in an opposite direction, so as to restore said ambient air pressure to said fixing device.

4. A coil arrangement as claimed in claim 1 wherein said air pressure fixing device comprises a piston in a cylinder, and at least one airbag in communication with said cylinder, said piston being operable by said control switch.

5. A coil arrangement as claimed in claim 4 wherein said control switch is a rotatable knob, said knob being rotatable in a first direction that pulls said piston in said cylinder to generate said negative pressure, and thereby also generating said negative pressure in said airbag in communication with said cylinder, and said knob being rotatable in an opposite direction to restore said ambient air pressure in said cylinder and in said airbag.

6. A coil arrangement as claimed in claim 1 wherein said control switch is located at an accessible exterior of said holder.

* * * * *